United States Patent
Dahlgren

(10) Patent No.: US 8,860,868 B2
(45) Date of Patent: Oct. 14, 2014

(54) METHOD OF SETTING FOCUS OF A DIGITAL VIDEO CAMERA AND A DIGITAL VIDEO CAMERA DOING THE SAME

(71) Applicant: Axis AB, Lund (SE)

(72) Inventor: Gunnar Dahlgren, Gothenburg (SE)

(73) Assignee: Axis AB, Lund (SE)

( * ) Notice: Subject to any disclaimer, the term of this patent is extended or adjusted under 35 U.S.C. 154(b) by 0 days.

(21) Appl. No.: 14/054,220

(22) Filed: Oct. 15, 2013

(65) Prior Publication Data
US 2014/0118571 A1  May 1, 2014

Related U.S. Application Data

(60) Provisional application No. 61/721,286, filed on Nov. 1, 2012.

(51) Int. Cl.
*H04N 5/225* (2006.01)
*G02B 13/16* (2006.01)
*H04N 5/232* (2006.01)
*H01L 27/146* (2006.01)

(52) U.S. Cl.
CPC ...... *H04N 5/23212* (2013.01); *H01L 27/14609* (2013.01); *H04N 5/2254* (2013.01); *H01L 27/14625* (2013.01)
USPC .......................................................... 348/335

(58) Field of Classification Search
USPC ................. 348/335, 340, 345, 348, 350, 352; 396/79, 80, 82
See application file for complete search history.

(56) References Cited

U.S. PATENT DOCUMENTS

| | | | |
|---|---|---|---|
| 6,819,360 B1 * | 11/2004 | Ide et al. ........... | 348/340 |
| 2010/0215354 A1 | 8/2010 | Ohnishi | |
| 2010/0232776 A1 | 9/2010 | Ohnishi | |
| 2012/0154651 A1 | 6/2012 | Ohno | |

FOREIGN PATENT DOCUMENTS

| | | |
|---|---|---|
| EP | 2 028 843 A2 | 2/2009 |
| WO | WO 2006/039486 A2 | 4/2006 |

OTHER PUBLICATIONS

Search Report dated Mar. 26, 2013, issued in European Patent Application No. 12189977.7.

* cited by examiner

*Primary Examiner* — Yogesh Aggarwal
(74) *Attorney, Agent, or Firm* — Oblon, Spivak, McClelland, Maier & Neustadt, L.L.P.

(57) ABSTRACT

A digital video camera that includes a photo sensor having a plurality of pixels, each pixel being arranged to obtain and output pixel data, a focusing device to set a focus of the digital video camera, a processing unit to process pixel data from a first subset of the pixels such that image frames of said video image stream are rendered based on pixel data in said first subset of pixels, and an array of micro lenses covering a second subset of the pixels, each of said micro lenses covering a number of pixels. The first subset of pixels is confined within an area and the second subset of pixels is arranged outside and adjacent to said first subset of pixels such that a frame of pixels of said second subset is formed around said first subset of pixels.

12 Claims, 2 Drawing Sheets

US 8,860,868 B2

METHOD OF SETTING FOCUS OF A DIGITAL VIDEO CAMERA AND A DIGITAL VIDEO CAMERA DOING THE SAME

CROSS-REFERENCE TO RELATED APPLICATIONS

This application claims the benefit of U.S. provisional application Ser. No. 61/721,286, filed on Nov. 1, 2012, and claims the benefit of priority under 35 U.S.C. §119 from European Patent Application No. 12189977.7, filed Oct. 25, 2012. The entire contents of which are incorporated herein by reference.

TECHNICAL FIELD

The present invention relates to a method of setting focus of a digital video camera and a digital video camera doing the same.

BACKGROUND

In a digital video camera, the image from the lens must at all times be focused directly on the photo sensor. If that is not done properly, the image will be blurry and more-or-less impossible to correct afterwards. There is commonly an auto-focus algorithm running that tries to analyze the image contents, and continuously adjust the focus lens to keep the image in focus. A common method for performing this auto-focus is the so called contrast detection auto-focus. Contrast detection auto-focus is widely used in digital video cameras of today.

Contrast detection auto-focus is achieved by measuring contrast within a sensor field, through the lens. The intensity difference between adjacent pixels of the sensor naturally increases with correct image focus. The optical system can thereby be adjusted until the maximum contrast is detected.

A difficulty for contrast detection auto-focus algorithms is that if the image suddenly becomes slightly blurry, for instance when zooming or panning, or if the lighting condition is poor, it is hard to determine if the lens shall be moved closer or further away. If moving in the wrong direction, the image will become even more blurry, and potentially important video information is irrecoverably lost. In the worst case, the digital video camera loses track of the correct focus position altogether, resulting in the necessity of a full focus sweep to find the correct focus position again. Such a sweep might take several seconds to complete, during which the video will be more or less useless.

SUMMARY OF THE INVENTION

In view of the above, an objective of the present invention is to provide a digital video camera and a method for supporting and guiding the normal contrast detection auto-focus of the digital video camera to find the correct focus setting.

In particular, according to a first aspect of the invention, a digital video camera for finding a correct focus setting when capturing a video image stream of a scene is provided. Said digital video camera comprises: a photo sensor having a plurality of pixels, each pixel being arranged to obtain and output pixel data; a focusing device arranged to set a focus of the camera; a processing unit arranged to process pixel data from a first subset of the pixels such that image frames of said video image stream are rendered based on pixel data in said first subset of pixels; an array of optical elements covering a second subset of the pixels, each of said optical elements covering a number of pixels, wherein the first subset of pixels is confined by a single endless border and the second subset of pixels is arranged outside and adjacent to said single endless border of said first subset, wherein said processing unit further is arranged to process pixel data from said second subset of said plurality of pixels such that information pertaining to distance to one or more objects in said scene is extracted, wherein said focusing device is arranged to set the focus of the camera based on said information pertaining to distance to one or more objects.

When disclosing the present invention the term "objects in said scene" shall be interpreted in a wide sense, thus objects in said scene may be a person, a car, a house etc., but it may also be an area of the ground, a part of a wall, a part of a territory etc.

Moreover, the term border can be considered as an imaginary line surrounding said first subset of pixels of said photo sensor, i.e. the expression "single endless border" does not mean that there needs to be an actual physical element surrounding the pixels, this is merely a way of describing that the first subset of pixels are all placed within a certain area. Obviously a physical border could be present, but this is not required.

A benefit compared to a normal digital video camera with contrast detection auto-focus is that with the provided digital video camera it will be possible to know with a much higher probability in which direction a focus lens of the focusing device shall be moved to keep the scene in focus. This will lead to a more robust and potentially also faster auto-focus, at a low extra cost.

Said focusing device may further be arranged to set the focus of the digital video camera based on a contrast detection autofocus algorithm operating on pixel data from said first subset of pixels and to be guided towards a new focus setting of said digital video camera based on said information pertaining to distance to one or more objects.

Said processing unit may further be arranged to process said information pertaining to distance to one or more objects in said scene such that information pertaining to if said one or more objects is located further away or closer to said digital video camera as compared to a current focus setting of said digital video camera is extracted.

Said focusing device may further be arranged to be directed towards a new focus setting by said information pertaining to if said one or more objects is located further away or closer to the camera as compared to a current focus setting of said camera.

Said optical elements may be integrally formed with a cover glass of said photo sensor. By forming said optical elements integrally with the cover glass of said photo sensor a compact photo sensor assembly may be achieved. Moreover, by this design the optical elements are arranged close to the photo sensor.

Alternatively, said optical elements may be integrally formed with an IR filter of said photo sensor. This too will lead to a compact photo sensor assembly.

According to a second aspect of the present invention a method of setting focus of a digital video camera for capturing a video image stream of a scene is provided. Said method comprising the steps of: providing a photo sensor having a plurality of pixels, each pixel being arranged to obtain and output pixel data; defining a first subset of pixels as pixels present within a single endless border; defining a second subset of pixels as pixels outside and adjacent to the single endless border; arranging an array of optical elements covering the second subset of pixels, each of said optical elements covering a number of pixels; processing pixel data from the first subset of pixels such that image frames of said video image stream are rendered based on pixel data in the first subset of pixels; processing pixel data from the second subset of pixels such that information pertaining to distance to one or more objects in said scene is extracted, and setting focus of said digital video camera based on said information pertaining to distance to one or more objects.

The step of setting the focus of said digital video camera may comprise: applying a contrast autofocus algorithm on the pixel data from the first subset of pixels; processing said information pertaining to distance to one or more objects in said scene such that information pertaining to if said one or more objects is located further away or closer to said digital video camera as compared to a current focus setting of said digital video camera is extracted; and directing said digital video camera towards a new focus setting by applying said information pertaining to if said one or more objects is located further away or closer to said digital video camera as compared to a current focus setting of said digital video camera, wherein said digital video camera is out of focus in the current focus setting.

BRIEF DESCRIPTION OF THE DRAWINGS

These and other aspects of the present invention will now be described in more detail, with reference to appended drawings showing embodiments of the invention. The figures should not be considered limiting the invention to the specific embodiment; instead they are used for explaining and understanding the invention.

DESCRIPTION OF EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The basic idea of this invention is to use the same concept as in a light-field, or plenoptic, camera in order for supporting and helping a digital video camera implementing a contrast detection auto-focus algorithm to find the correct focus point. A light-field, or plenoptic, camera records not only the total intensity of light in each "pixel" of the light-field, or plenoptic, camera, but rather the intensity of light coming from each direction, in each "pixel" of the light-field, or plenoptic, camera. A light-field "image" is not viewable in a meaningful fashion as-is, but by applying processing it is possible to produce photographic images with various properties. The most well-known such property is the possibility of changing the focus position (the distance to the object(s) being rendered sharply) after the shot has been taken. Following from this fact it is easily understood that information about the distance to objects in the scene is embedded in the light-field image.

In a light-field, or plenoptic, camera a layer of optical elements (e.g. micro lenses) is applied above the photo sensor (not to be confused with the micro lenses normally included in each photo sensor pixel used to focus the incoming light ray into each photo sensor pixel). The layer of optical elements is typically arranged a fraction of a millimeter above the photo sensor. Each optical element works as one "pixel" of the light field camera, and the main lens is focused such that its image is in focus (more or less) at the layer of optical elements. Typically, but not mentioned as a limiting example, the size of the optical elements is around 10×10 photo sensor pixels each, hence each one of the optical elements produce a 10-pixels-diameter circular image on the photo sensor.

According to the present invention a layer having a frame shaped array of optical elements (e.g. micro lenses), leaving a big area in the middle without optical elements, is used. By arranging one or a few rows of optical elements within the border of the photo sensor, the rest of the sensor can be used as an ordinary camera sensor, while it is possible to use the area adjacent to the border to collect information on changes in the depth of the scene. That is, a number of rows/columns of pixels adjacent to the border of the sensor are sacrificed to produce a distance sensor.

Figure 1:
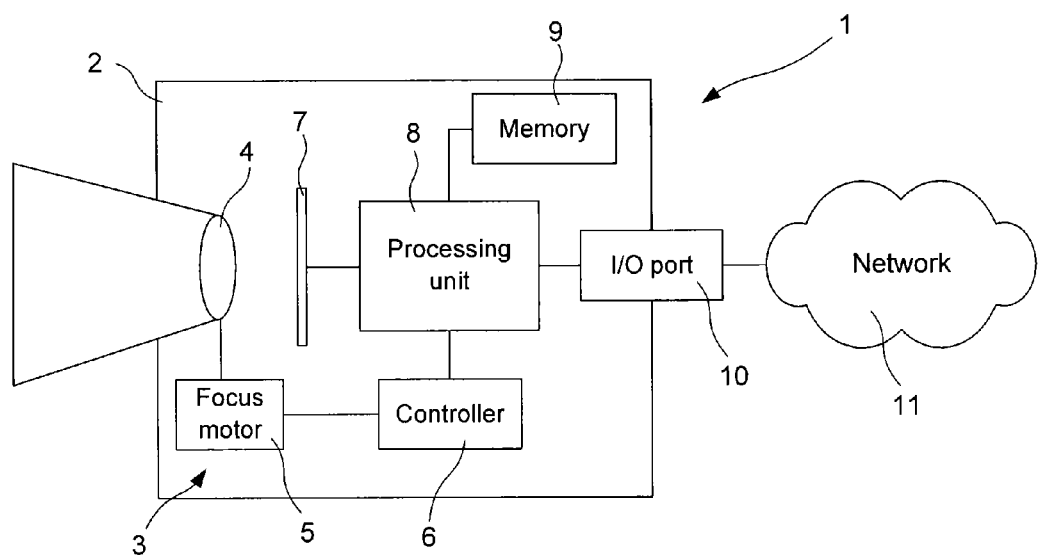
FIG. 1 is a schematic view of a digital video camera according to an embodiment of the invention.
Figure 2:
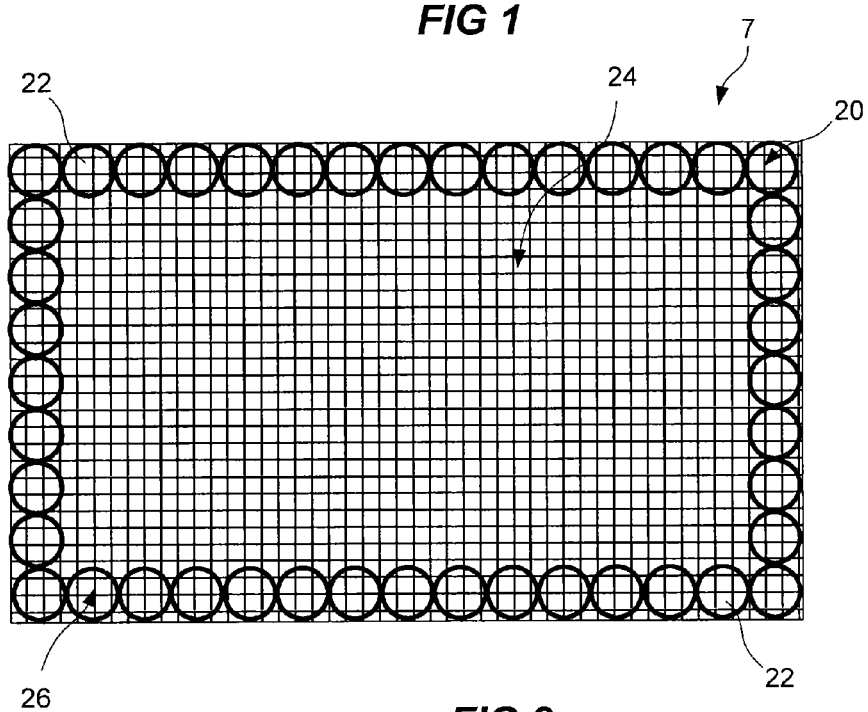
FIG. 2 is a schematic view of an array of optical elements covering a subset of the pixels of a photo detector of the digital video camera according to FIG. 1.

In FIGS. 1 and 2 an embodiment of a digital video camera 1 according to the present invention, is illustrated. The digital video camera 1 includes a zooming function, i.e. the focus of the digital video camera 1 may vary. Moreover, the digital video camera 1 may be connectable to a digital network. Further, the digital video camera 1 may be a portable camera, a stationary camera or a camera having pan/tilt functionality. The digital video camera 1 may be a camera for monitoring applications, such as surveillance purposes, machine vision, store compliance, business information, etc. In order to facilitate the understanding of the invention, standard features of a digital video camera not being relevant for the present invention are not described.

The digital video camera 1 comprises a housing 2, a focusing device 3 comprising a focusing lens 4, a focus motor 5 and a controller 6, a photo sensor 7, a processing unit 8, a memory 9 and an I/O-port 10.

The I/O-port 10 is according to the shown embodiment used to connect the digital video camera 1 to a communication network 11. The digital video camera 1 may however also be connected directly to a monitor to show images or a recorder for saving images. The communication network 11 may be any kind of communication network for communicating digital image information, such as a wire line or wireless data communication network, e.g. a local area network (LAN) or a wireless local area network (W-LAN) or a Wide Area Network (WAN).

The photo sensor 7 is arranged to capture images of a video image stream of a scene. The photo sensor 7 may for example be a Charge Coupled Device (CCD) sensor, a Complementary Metal Oxide Semiconductor (CMOS) sensor, or similar, for registering incident light. The photo sensor 7 comprises a plurality of sensor pixels. The photo sensor 7 is arranged to output pixel data for each sensor pixel. The pixel data of each sensor pixel is a function of the number of photons received by said sensor pixel.

As can be seen in FIG. 2 the photo sensor 7 is partly covered by an array 20 of optical elements 22. More precisely, the array 20 of optical elements 22 is arranged in front of and adjacent to said photo sensor 7. It shall be understood that the sizes of optical elements and sensor pixels are exaggerated for illustrative purposes and, thus, are provided to illustrate the general structures of embodiments of the present invention.

The pixels of the photo sensor 7 may be divided into two subsets, a first subset 24 of the pixels of the photo sensor 7 not being covered by the array 20 of optical elements 22 and a second subset 26 of the pixels of the photo sensor 7 being covered by the array 20 of optical elements 22. Each of said optical elements 22 is covering a number of pixels of the photo sensor 7. The optical elements 22 comprise micro lenses of a type used in a light-field camera. The array 20 of optical elements 22 is arranged to refract incident light rays over said second subset 26 of pixels.

The first subset 24 of pixels is confined by a single endless border. The second subset 26 of pixels is arranged outside and adjacent to said single endless border of said first subset 24. More precisely, said second subset 26 of pixels is surrounding said single endless border of said first subset such that a frame of pixels of said second subset is formed. As a non-limiting example, said frame of pixels of said second subset 26 of pixels is 10-50 pixels wide. It is however realized that the width of said frame of pixels of said second subset 26 may be as small as 1-2 pixels and as wide as a few hundreds of pixels. The upper limit of the number of pixels used depends on the size of photo sensor area it is possible to sacrifice for the distance sensor.

The array 20 of optical elements 22 constitutes a frame of optical elements 22 covering an outer portion, close to the border, of the photo sensor 7 leaving an area in the middle of the photo sensor 7 without optical elements. According to the embodiment shown in FIG. 2 a single row of optical elements 22 is arranged around the border of the photo sensor 7. It shall however be understood that two or more rows of optical elements 22 may be used.

Typically, but not mentioned as a limiting example, each optical element 22 covers approximately 10×10 pixels of the photo sensor 7. With this in mind, the sizes of the pixels and optical elements as illustrated in FIG. 2 are exaggerated for illustrative purposes and, thus, are provided to illustrate the general structures of embodiments of the present invention and not to represent an actual relationship between the size of the optical elements 22 and the pixels of the photo sensor 7.

Moreover, normally a width of said optical elements 22 correlates with a width of the pixels of said photo detector 7. Hence, the width of said optical elements 22 are N times the width of the pixels of said photo detector 7, wherein N is an integer value, and the optical elements would typically cover a number of whole pixels, such that one pixel typically would only be covered by one optical element.

By arranging one or a few rows of optical elements 22 around the border of the photo sensor 7, the rest of the photo sensor 7 can be used as an ordinary camera photo sensor, while it is possible to use the border area to collect information on changes in the depth of the scene. That is, a number of rows/columns of pixels around the border of the photo sensor 7 are sacrificed to produce a distance sensor.

The optical elements 22 may be integrally formed with an IR filter of said photo sensor 7. Alternatively, the optical elements 22 may be integrally formed with a cover glass of said photo sensor 7. However, the person skilled in the art realizes that the optical elements 22 may also be a standalone layer positioned in front of the photo sensor.

The processing unit 8 is arranged to receive pixel data from the photo sensor 7. The processing unit 8 is moreover arranged to process the pixel data from said first subset 24 of the pixels such that image frames of said video image stream are rendered based on pixel data in said first subset 24 of pixels. The processing unit 8 is further arranged to process pixel data from said second subset 26 of the pixels such that information pertaining to distance to one or more objects in said scene is extracted. This is done by determining the directions of incoming light rays and therefrom to determine said information pertaining to distance to one or more objects in said scene. Objects in the scene shall be interpreted in a wide sense, thus objects in said scene may be a person, a car, a house etc., but it may also be an area of the ground, a part of a wall, a part of a territory etc.

Thus, the pixel data from at least some of the pixels of the first subset 24 of pixels constitute pixel data building up image frames of said video image stream captured by the digital video camera 1, whereas the pixel data from at least some of the pixels of the second subset 26 of pixels is used for determining a distance to one or more objects in said scene captured by the digital video camera 1.

The processing unit 8 is further arranged to process said information pertaining to distance to one or more objects in said scene such that information pertaining to if said one or more objects is located further away or closer to the camera 1 as compared to a current focus setting of said focusing device 3 is extracted.

The focusing device 3 is arranged to set a focus of the camera 1. This is done by modifying the focus of the focusing device 3. The focus of the focusing device 3 is modified by translating the focus lens 4 along an optical axis of the camera 1. The focusing lens 4 is moved by means of the focus motor 5. The focus motor 5 is controlled by means of the controller 6. Hence, the focus motor 5 is connected to the focusing lens 4 and is arranged to move the focusing lens 4. Moreover, the controller 6 is connected to the focusing motor 5 and is arranged to control the focusing motor 5. The controller 6 is getting input data from the processing unit 8.

The focusing device 3 forms part of an auto focus unit of said digital video camera 1. The focusing device 3 is arranged to set the focus of the digital video camera 1 based on a contrast detection autofocus algorithm operating on pixel data from said first subset of pixels. Contrast detection autofocus is achieved by measuring contrast within a sensor field, through the lens. The intensity difference between adjacent pixels of the sensor naturally increases with correct image focus. The optical system can thereby be adjusted until the maximum contrast is detected. Contrast detection autofocus does not involve actual distance measurement at all. Thus, as the contrast detection autofocus does not calculate whether the subject is in front focus or back focus, focus tracking is not feasible.

According to this invention, in order to achieve a form of focus tracking, the focusing device 3 is in addition arranged to be guided towards a new focus setting of the digital video camera 1 based on said information pertaining to distance to one or more objects. More precisely, said information pertaining to if said one or more objects is located further away or closer to the camera 1 as compared to a current focus setting of said focusing device 3 is used to direct the focusing device 3 towards a new focus setting.

Hence, said focusing device 3 is arranged to set the focus of the camera 1 based on various factors, including contrast detection autofocus and said information pertaining to distance to one or more objects in the scene.

As an example, it may be illustrative to consider a situation where the digital video camera 1 is focused at an initial focus distance in a wide angle zoom position. A large scene is visible to the camera 1, and the autofocus has been set to give a clear image of a large part of the scene. Then, for some reason, e.g. movement taking place or an operator decides that an item of interest is present in a specific part of the scene, a zooming action takes place. After the zooming action, only a smaller part of the scene is visible to the digital video camera 1, and the camera 1 is set in a telezoom position. However, the scene parts that are visible to the camera 1 may now be out of focus, as the first focus setting was chosen to give a sharp image of the entire scene, i.e. the focus was set to an average distance for the scene. The autofocus is unaware of if the new smaller part of the scene now visible is situated closer to the camera or further away than the average distance in the previous wide-angle scene.

The output from the distance sensor comprising the optical elements 22 located at the border of the photo sensor 7, may now be used to guide the autofocus to a new correct position. This may be made by setting the autofocus to a distance to an object in the scene which is extracted by the distance sensor from said information pertaining to distance to one or more objects in said scene. Alternatively, this may be made by instructing or guiding the autofocus algorithm to start searching for focus in a certain direction (further away or closer to the camera as compared with a current focus setting). The decision if the new focus setting is further away or closer to the camera as compared with a current focus setting is based on a difference in the distance to an object in the scene. The difference in the distance to an object in the scene being extracted by means of the distance sensor by comparing a distance to an object in the scene before the zoom action took place and a distance to the object in the scene after the zoom action took place. In other words, in case the distance to the object in the scene has become larger compared to when the image was in focus, the autofocus should start its search for focus in the direction further away. This could happen e.g. when going from a wide angle zoom setting to a telezoom setting in order to zoom in on an object further away than the average distance to the wide-angle scene. In case the zoomed in object is instead situated in the foreground of the scene, the distance to the object in the scene would be smaller compared to when the image was in focus.

The direction guidance saves the autofocus from having to search the entire available focus interval, which in turn limits the time when the digital video camera 1 is out of focus, thus, the time when the output video image stream from the digital video camera 1 is blurry and being more or less useless is limited.

It should also be noted that since the optical elements 22 are placed in the outer region of the photo sensor 7, framing or surrounding the main part (first subset 24) of the pixels of the photo sensor 7, information pertaining to distance to one or more objects in the outermost region of the visible part of the scene is extracted. Such object may as previously mentioned e.g. simply be a part of the ground or other objects of the scene that are often consider as part of the background. However, as the inventor has realized, even if the objects that are to be in focus are often located in the middle of the image, the distance to the elements in the outer parts of the scene will in virtually all instances change in the same way as the distance to the objects in the more central parts of the image when the digital video camera 1 changes a zoom setting. At the very least it is very likely that the distance to objects in the outer parts of the visible part of the scene will change in the same direction (further away or closer) as the distance to the objects of interest in the more central parts. By placing the optical elements 22 at an outer region of the photo sensor 7, the normal image capture, as mentioned previously, is not disrupted, as would have been the case were they placed in other positions.

Figure 3:
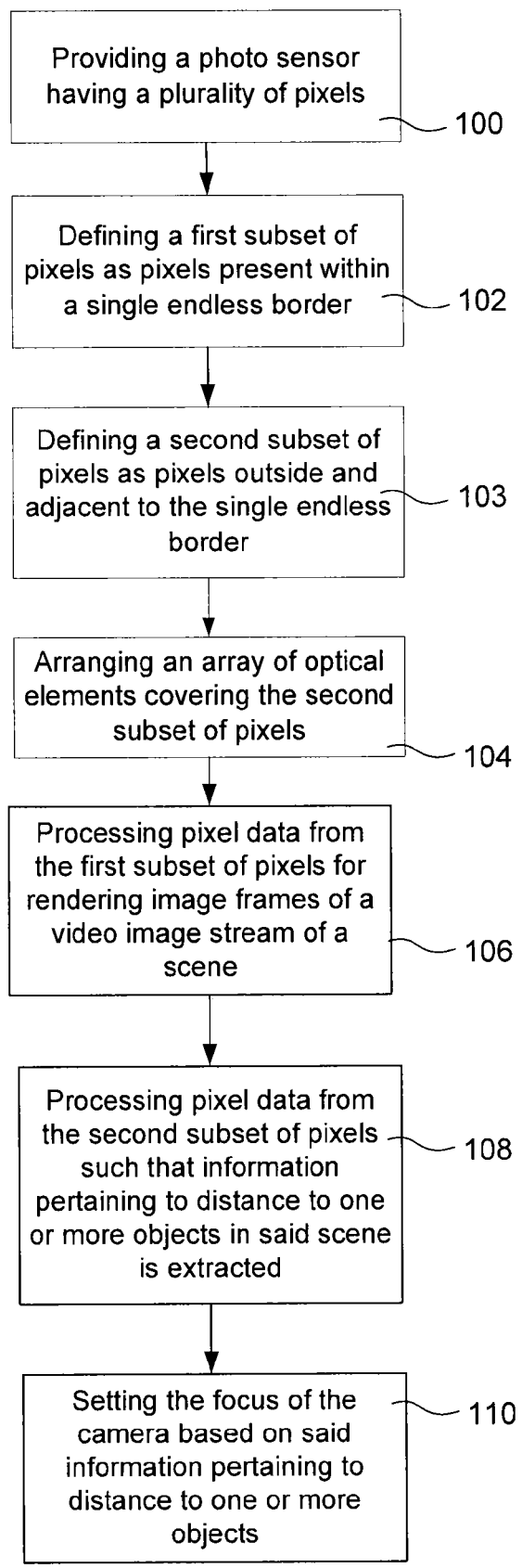
FIG. 3 is a schematic flow chart, showing a method according to an embodiment of the invention.

FIG. 3 illustrates an embodiment of a method of setting focus of a digital video camera for capturing a video image stream of a scene. The method comprises: providing 100 a photo sensor having a plurality of pixels, each pixel being arranged to obtain and output pixel data; defining 102 a first subset of pixels as pixels present within a single endless border; defining 103 a second subset of pixels as pixels outside and adjacent to the single endless border; arranging 104 an array of optical elements covering the second subset of pixels, each of said optical elements covering a number of pixels; processing 106 pixel data from the first subset of pixels such that image frames of said video image stream are rendered based on pixel data in the first subset of pixels; processing 108 pixel data from the second subset of pixels such that information pertaining to distance to one or more objects in said scene is extracted; and setting 110 focus of the camera based on said information pertaining to distance to one or more objects.

The step of setting the focus of the digital video camera may comprise: applying a contract detection autofocus algorithm on the pixel data from the first subset of pixels; processing said information pertaining to distance to one or more objects in said scene such that information pertaining to if said one or more objects is located further away or closer to the digital video camera as compared to a current focus setting of the digital video camera is extracted; and directing said digital video camera towards a new focus setting by applying said information pertaining to if said one or more objects is located further away or closer to the camera as compared to a current focus setting of the camera, wherein said digital video camera is out of focus in the current focus setting.

The person skilled in the art realizes that the present invention by no means is limited to the preferred embodiments described above. On the contrary, many modifications and variations are possible within the scope of the appended claims.

For example, the focus of the focusing device 3 may be modified by using a focus lens made of liquid crystals or oil/water surfaces being electrically affected in order to change the focusing properties of the focus lens instead of using a focus motor moving the focus lens.

The processing unit may be implemented as a single processor or alternatively as a plurality of processors. If the processing unit comprises a plurality of processors each processor may have a dedicated function, e.g. one processor may be specialized in processing pixel data from the first subset of pixels such that image frames of said video image stream are rendered based on pixel data in the first subset of pixels; and another processor may be specialized in processing pixel data from the second subset of pixels such that information pertaining to distance to one or more objects in said scene is extracted.

In the description above the contrast detection auto-focus algorithm is mentioned as an auto-focus algorithm. It should however be realized that also other auto-focus algorithms may be used in connection with the present invention.

Additionally, variations to the disclosed embodiments can be understood and effected by the skilled person in practicing the claimed invention, from a study of the drawings, the disclosure, and the appended claims. Moreover, in the drawings and specification, there have been disclosed preferred embodiments and examples of the invention and, although specific terms are employed, they are used in a generic and descriptive sense only and not for the purpose of limitation, the scope of the invention being set forth in the following claims. In the claims, the word "comprising" does not exclude other elements or steps, and the indefinite article "a" or "an" does not exclude a plurality.

The invention claimed is:

1. A digital video camera for finding a correct focus setting when capturing a video image stream of a scene, comprising:
   a photo sensor having a plurality of pixels, each pixel being arranged to obtain and output pixel data;
   a focusing device arranged to set a focus of the digital video camera;

a processing unit arranged to process pixel data from a first subset of the pixels such that image frames of said video image stream are rendered based on pixel data in said first subset of pixels;

an array of micro lenses, of the type used in a light-field camera, arranged above and covering a second subset of the pixels, each of said micro lenses covering a number of pixels;

wherein the first subset of pixels is confined within an area and endlessly bordered by the second subset of pixels arranged outside and adjacent to said first subset of pixels such that a frame of pixels of said second subset is formed around said first subset of pixels;

wherein said processing unit further is arranged to process pixel data from said second subset of said plurality of pixels such that information pertaining to distance to one or more objects in said scene is extracted; and wherein said focusing device is arranged to set the focus of the digital video camera based on said information pertaining to distance to one or more objects.

2. The digital video camera according to claim 1, wherein said focusing device further is arranged to set the focus of the digital video camera based on an autofocus algorithm operating on pixel data from said first subset of pixels and to be guided towards a new focus setting of the digital video camera based on said information pertaining to distance to one or more objects.

3. The digital video camera according to claim 1 or 2, wherein said processing unit further is arranged to process said information pertaining to distance to one or more objects in said scene such that information pertaining to if said one or more objects is located further away or closer to said digital video camera as compared to a current focus setting of said digital video camera is extracted.

4. The digital video camera according to claim 3, wherein said focusing device is arranged to be directed towards a new focus setting by said information pertaining to if said one or more objects is located further away or closer to the digital video camera as compared to a current focus setting of said digital video camera.

5. The digital video camera according to claim 1, wherein said array of micro lenses is arranged to refract incident light rays over said second subset of pixels and wherein said processing unit is arranged to process pixel data from said second subset of pixels such that the directions of incoming light rays are determined and therefrom to determine said information pertaining to distance to one or more objects in said scene.

6. The digital video camera according to claim 1, wherein said array of micro lenses is arranged in front of and adjacent to said photo sensor.

7. The digital video camera according to claim 1, wherein said micro lenses are integrally formed with a cover glass of said photo sensor.

8. The digital video camera according to claim 1, wherein said micro lenses are integrally formed with an IR filter of said photo sensor.

9. The digital video camera according to claim 1, wherein said focusing device forms part of an auto focus unit of said digital video camera.

10. The digital video camera according to claim 1, wherein said focusing device comprises a focus motor arranged to move a focus lens.

11. A method of setting focus of a digital video camera for capturing a video image stream of a scene, comprising the steps of:

providing a photo sensor having a plurality of pixels, each pixel being arranged to obtain and output pixel data;

defining a first subset of pixels as pixels confined within an area;

defining a second subset of pixels as pixels arranged outside and adjacent to said first subset of pixels such that a frame of pixels of said second subset is formed around the endless border of said first subset of pixels;

arranging an array of micro lenses, of a type used in a light-field camera, above and covering the second subset of pixels, each of said micro lenses covering a number of pixels;

processing pixel data from the first subset of pixels such that image frames of said video image stream are rendered based on pixel data in the first subset of pixels;

processing pixel data from the second subset of pixels such that information pertaining to distance to one or more objects in said scene is extracted; and setting focus of the digital video camera based on said information pertaining to distance to one or more objects.

12. The method according to claim 11, wherein the step of setting the focus of the digital video camera comprises:

applying an autofocus algorithm on the pixel data from the first subset of pixels;

processing said information pertaining to distance to one or more objects in said scene such that information pertaining to if said one or more objects is located further away or closer to the digital video camera as compared to a current focus setting of digital video camera is extracted; and directing said digital video camera towards a new focus setting by applying said information pertaining to if said one or more objects is located further away or closer to the digital video camera as compared to a current focus setting of the digital video camera, wherein the digital video camera is out of focus in the current focus setting.

* * * * *

UNITED STATES PATENT AND TRADEMARK OFFICE
CERTIFICATE OF CORRECTION

PATENT NO. : 8,860,868 B2  Page 1 of 1
APPLICATION NO. : 14/054220
DATED : October 14, 2014
INVENTOR(S) : Gunnar Dahlgren It is certified that error appears in the above-identified patent and that said Letters Patent is hereby corrected as shown below:

On the Title Page, please add item (30):

"Foreign Application Priority Data
Oct. 25, 2012  (EP)..........................12189977.7"

Signed and Sealed this
Twenty-fourth Day of March, 2015

Michelle K. Lee
*Director of the United States Patent and Trademark Office*